United States Patent [19]

Tamura et al.

[11] Patent Number: 4,542,294
[45] Date of Patent: Sep. 17, 1985

[54] INFRARED DETECTOR AND METHOD OF PRODUCING THE SAME

[75] Inventors: Takashi Tamura, Sakai; Masami Ikeda, Osaka, both of Japan

[73] Assignee: Sanyo Electric Co., Ltd., Osaka, Japan

[21] Appl. No.: 521,541

[22] Filed: Aug. 9, 1983

[30] Foreign Application Priority Data

Aug. 10, 1982 [JP] Japan .................................. 57-139603

[51] Int. Cl.$^4$ ............................................ H01L 21/58
[52] U.S. Cl. ...................................... 250/338; 250/349
[58] Field of Search .................. 250/338 PY, 340, 349

[56] References Cited

U.S. PATENT DOCUMENTS 4,258,260 3/1981 Obara et al. .................. 250/338 PY
4,441,023 4/1984 Doctor et al. ................ 250/338 PY

FOREIGN PATENT DOCUMENTS 48623   3/1982  Japan ........................... 250/338 PY
66828   4/1983  Japan ........................... 250/338 PY
58-424  4/1983  Japan ........................... 250/338 PY Primary Examiner—Alfred E. Smith
Assistant Examiner—Constantine Hannaher
Attorney, Agent, or Firm—Armstrong, Nikaido, Marmelstein & Kubovcik

[57] ABSTRACT

A method of producing a pyroelectric type infrared detector comprising the steps of arranging two pyroelectric elements 25A and 35A polarized in opposite directions on support blocks 21A, and arranging, in combination, the support blocks 21A, on which the pyroelectric elements 25A and 35A are arranged, on a common base plate 40.

9 Claims, 13 Drawing Figures

INFRARED DETECTOR AND METHOD OF PRODUCING THE SAME

BACKGROUND OF THE INVENTION

1. Field of the Invention

This invention relates to a pyroelectric type infrared detector using pyroelectric elements that develop electric charges based on changes in the amount of incident infrared rays, and also to a method of producing the same.

2. Description of the Prior Art

FIG. 1 is a perspective view of a pyroelectric type infrared detector that motivated this invention. Referring to FIG. 1, the numeral 1 denotes a pyroelectric element that develops electric charges based on changes in the amount of incident infrared rays, said pyroelectric element 1 being made, e.g., of single crystals of lithium tantalate ($LiTaO_3$) or lithium niobate ($LiNbO_3$). This pyroelectric element 1 is polarized in advance in the direction of arrow P in FIG. 1 so that its front and back sides are positive and negative, respectively. The front side of the pyroelectric element 1 is formed with first and second surface electrodes 2a and 2b of the same area, respectively, spaced 0.1-1.0 mm apart. The first and second surface electrodes 2a and 2b are formed by vacuum deposition of a material having high infrared absorbability, such as nichrome or gold-black. On the other hand, the back surface of the pyroelectric element 1 is formed throughout with a back surface electrode 3, which is formed by vacuum deposition of the same material as that for the first and second front surface electrodes 2a and 2b.

The first and second front surface electrodes 2a and 2b are formed at one of their respective corners with first and second lead wire connection electrodes 4a and 4b, respectively, which are made of aluminum. The lead wire connection electrodes 4a and 4b have first and second lead wires 5a and 5b respectively connected thereto by ultrasonic wedge type bonding.

The pyroelectric element 1 formed with the first and second surface electrodes 2a and 2b and the back surface electrode 3, as described above, is supported on a metallic support block 6 made, e.g., of phosphor bronze or stainless steel. The metallic support block 6 has support portions 7 formed by acid etching at the four corners of its upper surface. The support portions 7 and the back surface electrode 3 are bonded together, e.g., by an epoxy type insulating adhesive agent 8. Therefore, the back surface electrode 3 is disposed in opposed relation to the support block 6.

In the arrangement shown in FIG. 1, since a space 9 is present between the pyroelectric element 1 and the support block 6, the pyroelectric element 1 is heat-insulated by the surrounding air, with the result that the efficiency of development of electric charges by the pyroelectric element 1 with respect to changes in the amount of incident infrared rays is greatly increased.

FIG. 2 shows an electric circuit including the infrared detector shown in FIG. 1. In FIG. 2, the infrared detector is represented by first and second capacitors 10a and 10b electrically connected in series. The numeral 11 denotes an impedance conversion circuit which, in view of the high resistance of the pyroelectric element 1, is incorporated to lower the resistance associated with an output terminal 12.

The impedance conversion circuit 11 comprises an input resistor 13 having a resistance value of $10^9-10^{11}\Omega$, and an FET (field-effect transistor) 14, and an output resistor 15 having a resistance value of about $10K\Omega$.

The infrared detector, which is constructed in the manner described above, is used as an intruder alarm that detects the approach or invasion of a human being and reports this information. In such use, for example as schematically shown in FIG. 3, the infrared detector is placed at the focus of a concave mirror 16 having on its reflecting surface a metal film having high infrared reflection coefficient, such as an aluminum film. If an intruder passes by as indicated by an arrow M, infrared rays from the intruder fall on the first front surface electrode 2a of the pyroelectric element 1, as indicated by an arrow $I_1$, resulting in a change in the amount of incident infrared rays, so that an electric charge develops. As the intruder moves, infrared rays from the intruder fall on the second front surface electrode 2b of the pyroelectric element 1, as indicated by an arrow $I_2$, resulting in a change in the amount of incident infrared rays, so that an electric charge develops. On the basis of the thus produced electric charges, a signal which can be used to report the invasion of the intruder appears at the aforesaid output terminal 12.

If the amounts of infrared rays incident on portions of the pyroelectric element 1 corresponding to the first and second front surface electrodes 2a and 2b change at the same time owing to changes in the ambient temperature, equal amounts of electric charges will be produced in the front surface electrodes 2a and 2b at the same time, but such electric charges will be produced in such a manner as to cancel each other. Thus, there is no possibility of an erroneous alarm being given by changes in the ambient temperature.

As shown in the circuit diagram of FIG. 4, in the case where the infrared detector comprises the first and second capacitors 17a and 17b electrically connected in parallel, it is necessary that on portions of the pyroelectric element 1 corresponding to the first and second front surface electrodes 2a and 2b, the latter is polarized in opposite directions (indicated by arrows $P_1$ and $P_2$). Otherwise, said electric charges produced by changes in the ambient temperature could not be cancelled by each other. In such case, the first and second lead wires 5a and 5b are connected to the gate of the FET 14, and with an electrically conductive adhesive agent used as the adhesive agent 8, the back surface electrode 3 is grounded through the adhesive agent 8 and support block 6.

To constitute such infrared detector, it is necessary to produce the pyroelectric element 1 that is polarized in opposite directions ($P_1$ and $P_2$) on portions of the pyroelectric element 1 corresponding to the first and second front surface electrodes 2a and 2b. Thus, this involves a troublesome operation and brings about a problem that the production cost of the infrared detector is very high.

SUMMARY OF THE INVENTION

Accordingly, a principal object of this invention is to provide a method whereby a pyroelectric type infrared detector comprising a plurality of pyroelectric elements each polarized in a desired direction can be easily produced.

Another object of this invention is to provide a pyroelectric type infrared detector comprising a plurality of pyroelectric elements each polarized in a desired direction, said detector being easily produced.

In a broad aspect of the invention, there is provided a method of producing a pyroelectric type infrared detector comprising the steps of arranging respectively on a plurality of support blocks a plurality of pyroelectric elements each polarized in a desired single direction and adapted to produce an electric charge based on a change in the amount of incident infrared rays, and arranging, in combination, said plurality of support blocks, on which said pyroelectric elements are arranged, on a common base plate.

In another aspect of this invention, there is provided a pyroelectric type infrared detector comprising a plurality of pyroelectric elements each polarized in a desired single direction and adapted to produce an electric charge based on a change in the amount of incident infrared rays, a plurality of support blocks for supporting said elements, and a common base plate on which said plurality of support blocks are arranged in combination.

The side of each support block opposed to the pyroelectric element may be formed with a recess, the air in said recess serving to heat-insulate the pyroelectric element, thus making it possible to increase the efficiency of development of electric charge of the pyroelectric element with respect to change in the amount of incident infrared rays.

Other objects and features of this invention will become more apparent from the following detailed description to be given with reference to the drawings.

DESCRIPTION OF THE PREFERRED EMBODIMENTS

Figure 1:
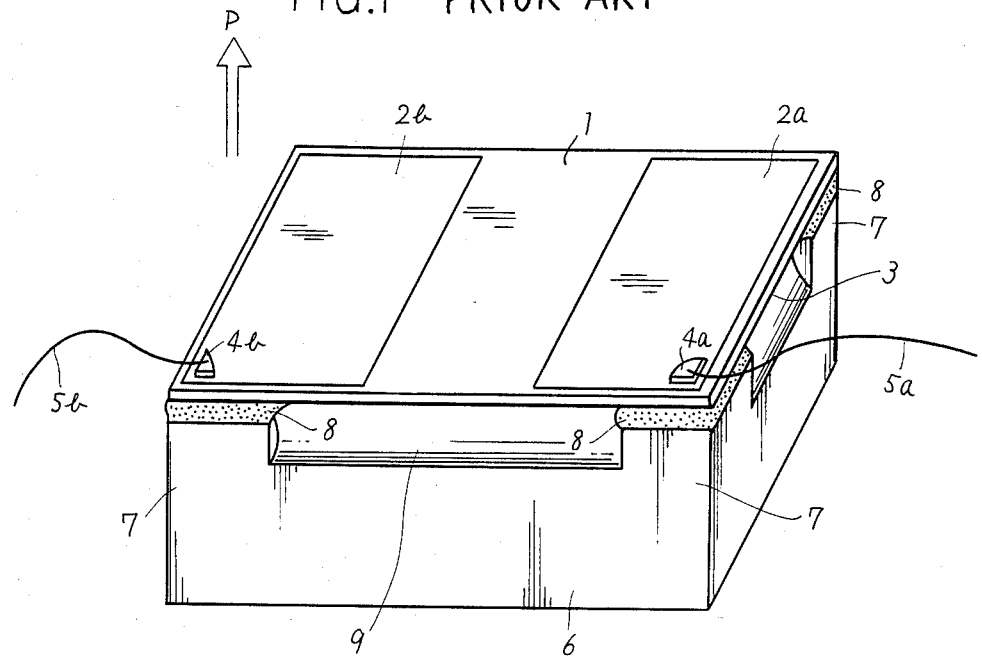
FIG. 1 is a perspective view of a conventional pyroelectric type infrared detector that motivated this invention.
Figure 2:
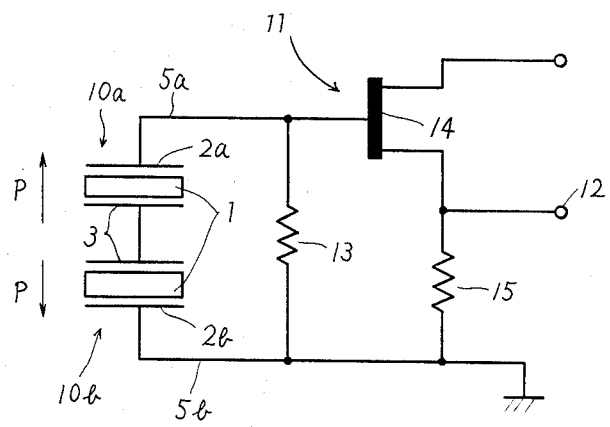
FIG. 2 is a circuit diagram including the conventional infrared detector shown in FIG. 1.
Figure 3:
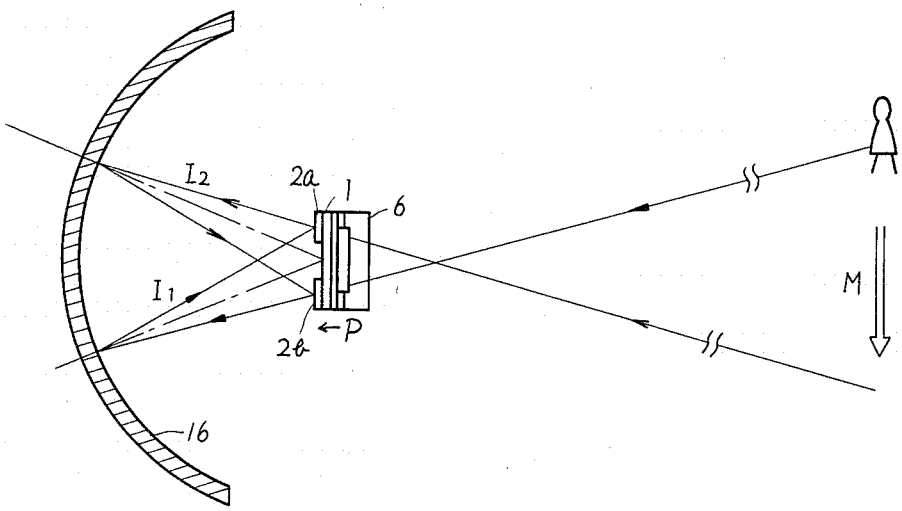
FIG. 3 is a side view, partly in section, showing the manner of using the infrared detector shown in FIG. 1.
Figure 5:
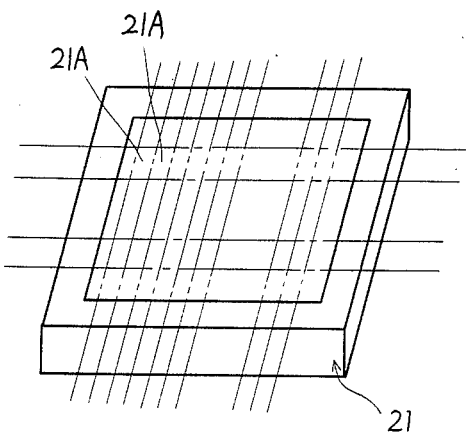
FIG. 5 is a perspective view showing a step of the process of embodying a production method according to an embodiment of this invention, illustrating a stock plate of which support blocks are produced.
Figure 6:
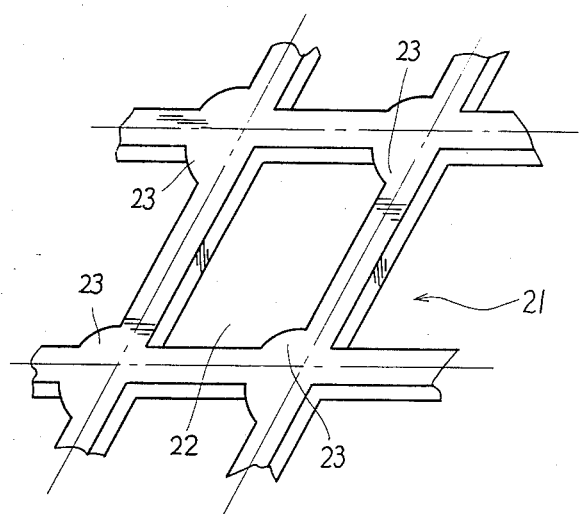
FIG. 6 is an enlarged perspective view of a portion of the stock plate for support blocks shown in FIG. 5.

FIG. 5 is a perspective view for explaining the first processing step in an embodiment of this invention. First, a stock plate 21 is prepared, which has a sufficiently large area to be finally diced along dash-dot lines in FIG. 5 to provide support blocks 21A. The upper surface of the stock plate 21 is formed with a number of recesses 22, as shown enlarged in FIG. 6. The recesses 22 are formed by acid etching in such a manner that each recess has lands 23 at two corners to which lead wires will be connected by ultrasonic bonding, as will be later described. In addition, it should be noted that in Fig. 6, each area surrounded with dash-dot lines contains a single recess 22. The recess 22 corresponds to the space 9 shown in FIG. 1, that is, heat-insulates a pyroelectric element 25A which is described hereafter.

Figure 7:
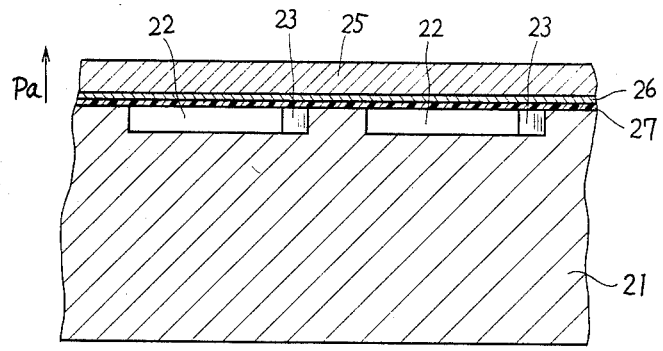
FIG. 7 is a partial sectional view for explaining the second step for the production method according to said embodiment of this invention, showing a pyroelectric wafer attached to a stock plate.

FIG. 7 is a partly sectional view for explaining the second step for the production method according to the embodiment of this invention. A 100–200 $\mu$m thick pyroelectric wafer 25 polarized in the direction of arrow Pa in advance is prepared. The back surface of the pyroelectric wafer 25 is formed with a back surface electrode 26 by vacuum deposition. The pyroelectric wafer 25 is arranged so that the back surface electrode 26 is opposed to the upper surface of the stock plate 21 for support blocks, and it is bonded to the upper surface of the stock plate 21 by an electrically conductive adhesive agent 27, the latter being then heated and hardened.

Figure 8:
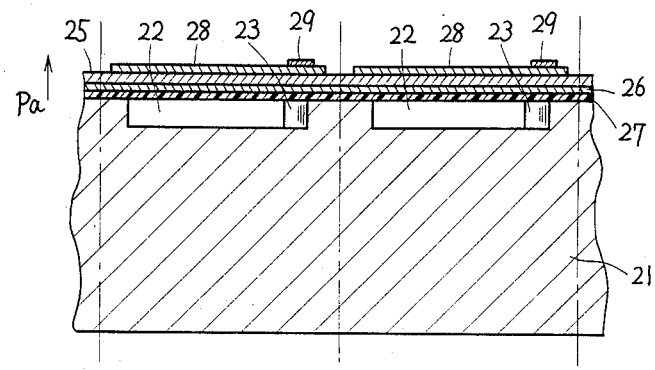
FIG. 8 is a partial sectional view for explaining the third step for the production method according to said embodiment of this invention, showing formation of front surface electrodes.
Figure 9:
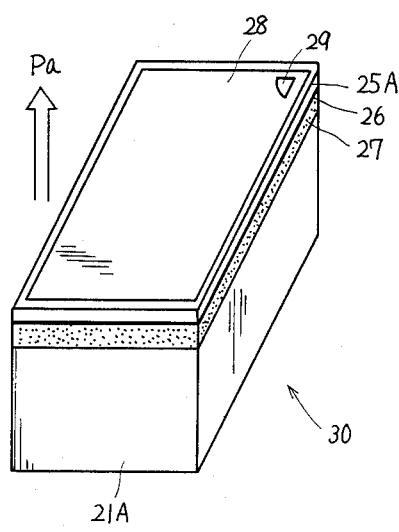
FIG. 9 is a perspective view of a first infrared ray detecting section for the infrared detector according to said embodiment of the invention.

FIG. 8 is a partly sectional view for explaining the third step for the production method in this embodiment. The front surface of said pyroelectric wafer 25 is polished until the thickness of the wafer is tens of $\mu$m, whereupon front surface electrodes 28 are formed on the front surface by vacuum deposition so as to cover the recesses 22. The front surface electrodes 28 are formed with corresponding lead wire connection electrodes 29 on their regions located above the lands 23. The thus formed pyroelectric wafer 25 and stock plate 21 are diced or separated along the dash-dot lines. As a result, there are obtained a plurality of first infrared ray detecting sections 30 wherein a pyroelectric element 25A polarized in a single direction, i.e., in the direction of arrow Pa, is placed on a support block 21A, as shown in FIG. 9.

Figure 10:
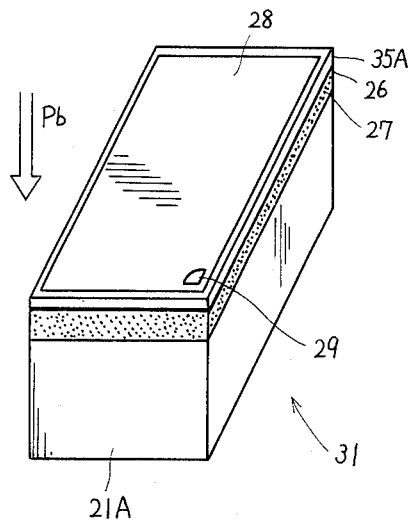
FIG. 10 is a perspective view of a second infrared ray detecting section for the infrared detector according to said embodiment of the invention, wherein a pyroelectric element polarized in a direction opposite to that for what is shown in FIG. 9.

FIG. 10 is a perspective view showing a second infrared ray detecting section 31 wherein a pyroelectric element 35A polarized in a direction opposite to said Pa direction, i.e., in the direction of arrow Pb, is placed on a support block 21A. The second infrared ray detecting section 31 can be produced by the same method as for said first infrared ray detecting section 30.

Figure 11:
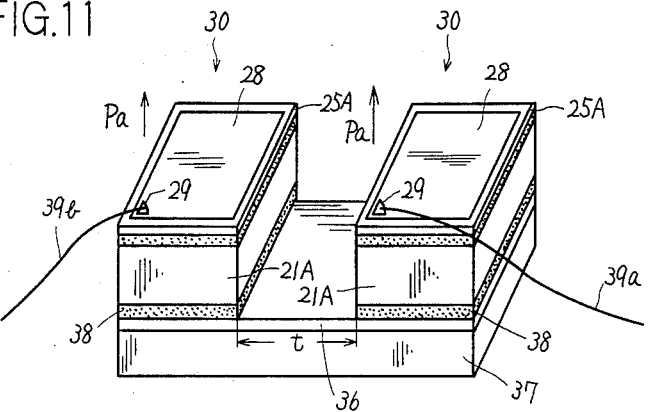
FIG. 11 is a perspective view of an infrared detector according to said embodiment of the invention.

FIG. 11 is a perspective view showing the final step for the production method in this embodiment. To an alumina insulation common base plate 37 having an electric conductive portion 36 formed on the upper surface thereof as by thick-film firing are bonded two aforesaid first infrared ray detecting sections 30 by an electrically conductive adhesive agent 38, said sections being spaced a predetermined distance t which is 0.5–1.0 mm. Thereafter, first and second lead wires 39a and 39b are connected to the electrodes 29 by ultrasonic bonding. In this way, an infrared detector having capacitors electrically connected in series, as in FIG. 1, can be obtained.

Figure 12:
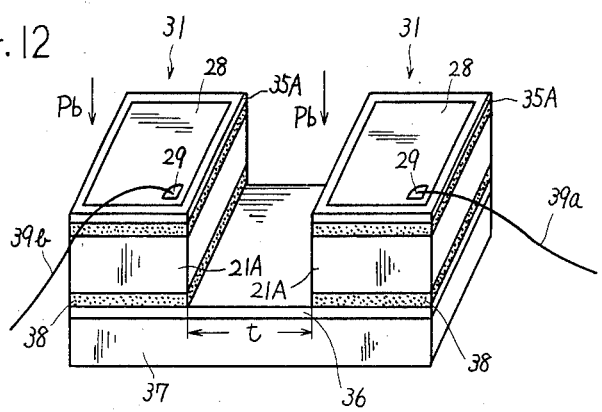
FIG. 12 is a perspective view of an infrared detector according to another embodiment of this invention.

FIG. 12 is a perspective view for explaining another example of the final step for the production method in said embodiment of this invention. In this case, an alumina insulation common base plate 37 having an electric conductive portion 36 has two second infrared ray detecting sections 31 bonded thereto by an electrically conductive adhesive agent 38. Thus, in this infrared detector, unlike the infrared detector shown in FIG. 11, because of the use of the pyroelectric elements 35A, the direction of polarization is reversed. Other details are the same as in the example shown in FIG. 11.

Figure 4:
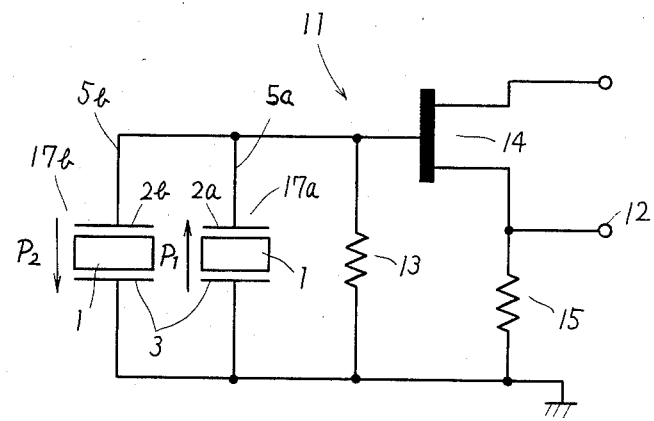
FIG. 4 is a circuit diagram including another example of a conventional infrared detector, the view corresponding to FIG. 2.
Figure 13:
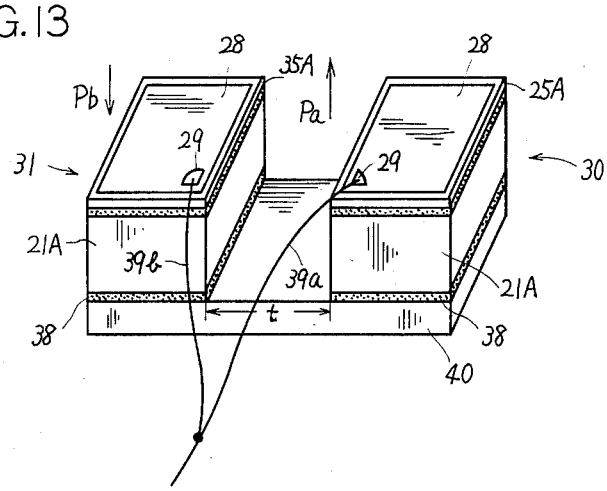
FIG. 13 is a perspective view of an infrared detector according to a further embodiment of this invention.

FIG. 13 is a perspective view for explaining a further example of the final step of the production method of this invention. A first infrared ray detecting section 30 and a second infrared ray detecting section 31 are bonded to a common base plate 40 made of phosphor bronze, stainless steel or the like by an electrically conductive adhesive agent 38. In this step, since the first and second infrared ray detecting sections 30 and 31 whose directions of polarization are opposite to each other are arranged in combination on the common base plate 40, an infrared detector having capacitors electrically connected in parallel, as in the circuit shown in FIG. 4, can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. The method of producing a pyroelectric type infrared detector comprising the steps of:
    preparing a plurality of pyroelectric elements, each mounted on a side of a support block and polarized to produce an electric charge of a desired polarity in response to incident infrared rays; and
    bonding said support blocks to one surface on a common base plate to obtain an infrared detector having a plurality of infrared ray detecting sections, each of a desired polarity, responsive to infrared rays from the same general direction.

2. The method recited in claim 1 further comprising the step of forming a recess in each support block in said side thereof to which said pyroelectric element is bonded.

3. The method recited in claim 1 wherein the polarity of each of said pyroelectric elements is the same.

4. The method recited in claim 1 wherein said pyroelectric elements include elements of opposite polarity.

5. The method recited in claim 1 wherein said pyroelectric elements consist of two elements of opposite polarities.

6. A pyroelectric type infrared detector comprising:
    an electrically conducting base plate;
    a plurality of support blocks bonded to one surface of said base plate; and
    a pyroelectric element supported on a side of each of said support blocks, each of said elements being polarized in a desired direction and adapted to produce an electric charge of desired polarity in response to incident infrared rays.

7. An infrared detector as recited in claim 6, wherein said side of each support block is formed with a recess.

8. An infrared detector as recited in claim 6, wherein said pyroelectric elements include two elements polarized in opposite directions.

9. The method of producing a pyroelectric type infrared detector comprising the steps of:
    (a) forming a first stock plate with a plurality of recesses in the upper surface thereof;
    (b) preparing a first polarized pyroelectric wafer of a first polarity;
    (c) bonding said first pyroelectric wafer to said upper surface of said first stock plate by an electrically conducted adhesive;
    (d) separating said bonded first stock plate and pyroelectric wafer into a plurality of first infrared ray detecting sections;
    (e) repeating steps (a), (b), (c) and (d) with a second stock plate and a second polarized pyroelectric wafer of a second polarity to produce a plurality of second infrared ray detecting sections; and
    (f) bonding one of said first infrared ray detecting sections and one of said second infrared ray detecting sections to one surface of a common base plate by a electrically conducting adhesive.

* * * * *